United States Patent [19]

Hosoya

[11] Patent Number: 4,930,003
[45] Date of Patent: May 29, 1990

[54] BURST/CONTINUOUS WAVE CONVERTING APPARATUS FOR CONVERTING CONTINUOUS WAVE IN RESPONSE TO BURSTS

[75] Inventor: Nobukazu Hosoya, Nara, Japan
[73] Assignee: Sanyo Electric Co., Ltd., Moriguchi, Japan
[21] Appl. No.: 242,108
[22] Filed: Sep. 9, 1988
[30] Foreign Application Priority Data
 Sep. 10, 1987 [JP] Japan .................. 62-226914
[51] Int. Cl.⁵ .............................................. H04N 9/46
[52] U.S. Cl. .................................... 358/19; 358/17
[58] Field of Search ............... 358/19, 17, 148, 158
[56] References Cited
 U.S. PATENT DOCUMENTS
 4,212,027 7/1980 Lemoine ........................... 358/19
 FOREIGN PATENT DOCUMENTS
 0052285 3/1982 Japan .

Primary Examiner—James J. Groody
Assistant Examiner—David E. Harvey
Attorney, Agent, or Firm—Armstrong, Nikaido, Marmelstein, Kubovcik & Murray

[57] ABSTRACT

A color synchronizing circuit (120) of a color television receiver includes a PLL circuit having a phase detector circuit (12b), an LPF (12c), a VCO (12d) and a ¼ frequency divider (12f). Color bursts extracted from a composite chrominance signal by a burst gate circuit (12a) are directly applied to an input of the above described PLL circuit through an adder (12g) in a burst period while being circulated through a loop including a delay circuit (12h) by a switch (12i). The delay circuit has a delay time which is equal to a period of the back porch of a horizontal synchronizing signal having the color burst inserted thereinto and is equal to integer multiples of a cycle of a chrominance subcarrier. Thus, the repetition frequency of the color burst sequentially supplied to the PLL circuit while being circulated through the above described loop becomes 16 times a horizontal frequency $f_H$. As a result, the sidebands which appear at the intervals of $f_H$ in the frequency spectrum of the color bursts is decreased, so that the capture range of the PLL circuit becomes wide.

8 Claims, 4 Drawing Sheets

FIG. 2A PRIOR ART    FIG. 2B PRIOR ART
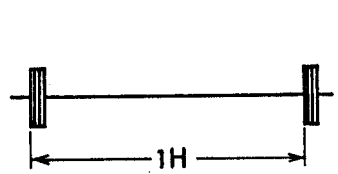 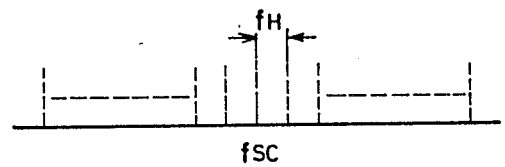
FIG. 4A    FIG. 4B
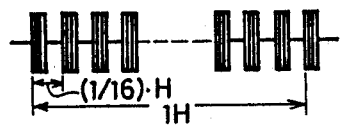 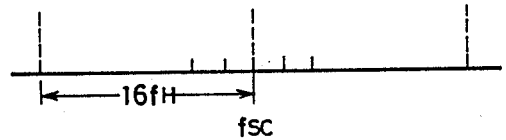

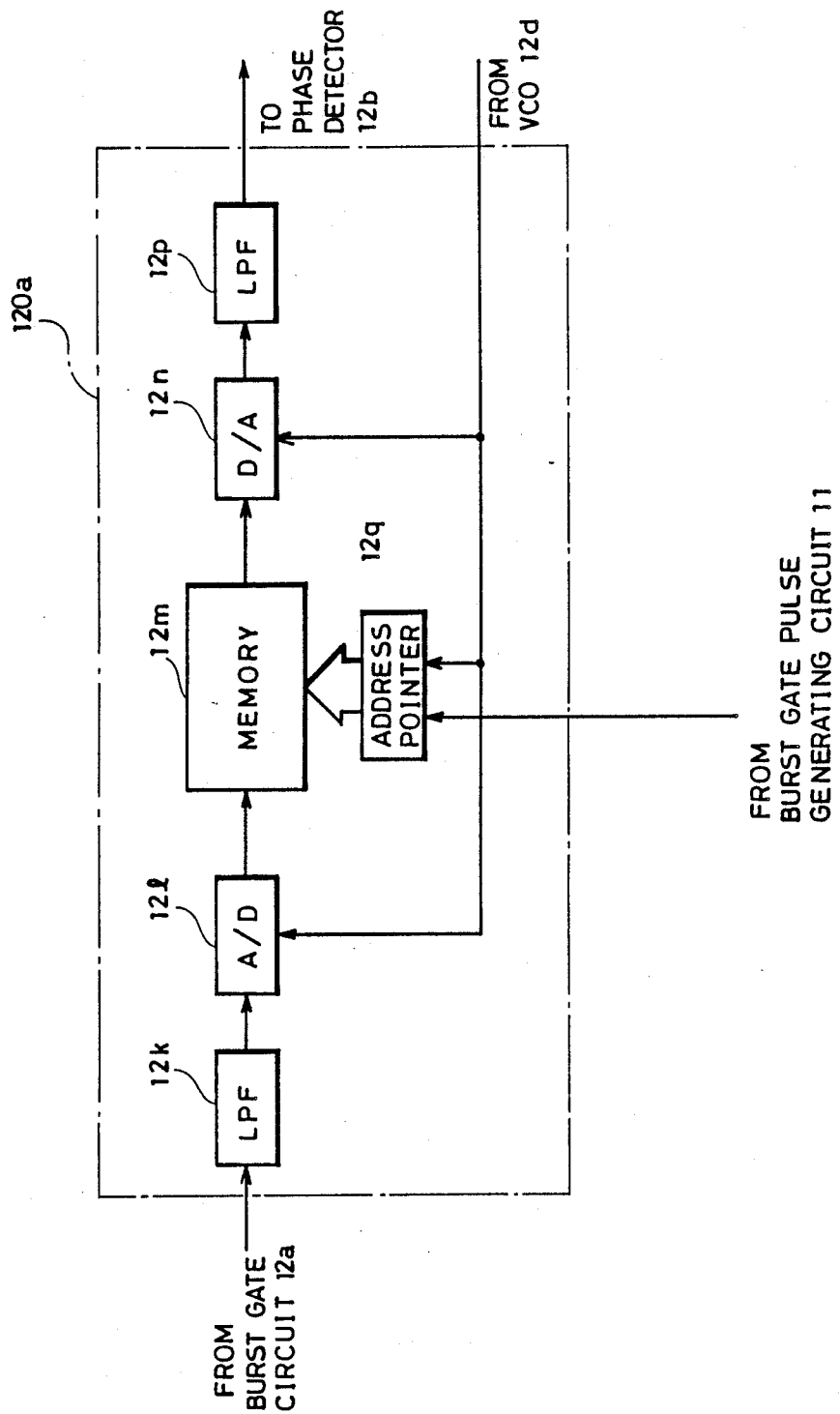

BURST/CONTINUOUS WAVE CONVERTING APPARATUS FOR CONVERTING CONTINUOUS WAVE IN RESPONSE TO BURSTS

BACKGROUND OF THE INVENTION

1. Field of the Invention

The present invention relates generally to a burst/continuous wave converting apparatus, and more particularly, to a burst/continuous wave converting apparatus for converting bursts to a continuous wave, such as a phase-locked loop (PLL) circuit, used as, for example, a color synchronizing circuit in a color television (TV) receiver or a time base corrector (TBC), a servo system of a spindle motor or a color converting circuit in a video tape recorder (VTR).

2. Description of the Prior Art

In general, a color television (TV) signal is transmitted with a carrier for a chrominance signal, i.e., a chrominance subcarrier being suppressed. Thus, when the chrominance signal is demodulated by synchronous detection in, for example, a color TV receiver, a chrominance subcarrier of 3.58 MHz must be generated using an oscillator on the side of the receiver, to be applied to a color demodulator. The frequency and the phase of the above described oscillator must be precisely controlled in response to color bursts sent superimposed on the back porch of a horizontal synchronizing signal in a video signal such that the chrominance subcarrier which is a continuous wave generated on the side of the receiver holds a correct frequency and phase for color demodulation. Therefore, in general, a PLL type color synchronizing circuit is used as a color synchronizing circuit for the color TV receiver, and a voltage controlled oscillator (VCO) is used as a chrominance subcarrier generating apparatus included therein. A continuous wave output of the VCO and the color bursts extracted from the received color TV signal are compared with each other in a phase detector, so that the frequency and the phase of the VCO are controlled in response to the comparison output. Such a PLL type color synchronizing circuit is disclosed in, for example, Japanese Patent Laying-Open Gazette No. 52285/1982.

FIG. 1 is a block diagram showing schematically a structure of a conventional color TV receiver using such a PLL type color synchronizing circuit.

In FIG. 1, a video intermediate frequency signal in a color TV signal received by a receiving antenna 1 and a tuner 2 is applied to an intermediate frequency amplifier circuit 3, to be amplified. The signal amplified in the intermediate frequency amplifier circuit 3 is further detected in a video detector circuit 4, so that a video signal is extracted. This extracted video signal is applied to a video amplifier circuit 5, to be amplified. An output of the video amplifier circuit 5 is applied to a color output circuit 6, a band-pass filter (BPF) 7, an automatic gain control (AGC) circuit 8 and a synchronizing separator circuit 9. The BPF 7 extracts a carrier chrominance signal and color bursts from the applied video signal, applies the carrier chrominance signal to a color demodulator circuit 10, and applies a composite chrominance signal comprising the carrier chrominance signal and the color bursts to a PLL type color synchronizing circuit 12. In addition, the AGC circuit 8 is responsive to a level of the video signal applied from the video amplifier circuit 5 for applying a control signal to the tuner 2 and the intermediate frequency amplifier circuit 3, to adjust the gain of the video signal. On the other hand, the synchronizing separator circuit 9 separates a horizontal synchronizing signal and a vertical synchronizing signal from the applied video signal and applies the horizontal synchronizing signal therein to a burst gate pulse generating circuit 11. The burst gate pulse generating circuit 11 responsively generates a burst gate pulse and applies the same to the PLL type color synchronizing circuit 12.

The PLL type color synchronizing circuit 12 comprises a burst gate circuit 12a, a phase detector circuit 12b, a low-pass filter (LPF) 12c, a VCO 12d (including a crystal resonator 12e), and a ¼ frequency divider 12f. The burst gate circuit 12a receives the composite chrominance signal from the BPF 7, and extracts only the color bursts in response to the burst gate pulse applied from the burst gate pulse generating circuit 11, to apply the same to one input of the phase detector circuit 12b. The VCO 12d oscillates at an oscillating frequency $4f_{SC}$ of four times a chrominance subcarrier frequency $f_{SC}$. An oscillation output of the VCO 12d is divided into ¼ by the ¼ frequency divider 12f and then, supplied to the other input of the phase detector circuit 12b. The phase detector circuit 12b compares phases of the applied color bursts and the oscillation output of the VCO 12d, so that the comparison output is supplied to the VCO 12d through the LPF 12c as a control voltage. As a result, a chrominance subcarrier which is a continuous wave synchronized with the color bursts is extracted from the ¼ frequency divider 12f, and applied to the color demodulator circuit 10.

The color demodulator circuit 10 extracts a color difference signal from the carrier chrominance signal using the chrominance subcarrier, and applies the same to the color output circuit 6. A color picture tube 13 is driven in response to an output signal of the color output circuit 6.

FIG. 2A is a waveform diagram showing the color bursts applied to the phase detector circuit 12b from the burst gate circuit 12a shown in FIG. 1, and FIG. 2B shows the frequency spectrum thereof.

As shown in FIG. 2A, the color bursts are a chrominance subcarrier corresponding to 8 to 9 cycles inserted into the back porch of the horizontal synchronizing signal on the side of transmission. Thus, the repetition frequency of the color bursts is equal to a horizontal frequency $f_H$ of the video signal. In addition, as shown in FIG. 2B, in the frequency spectrum thereof, sidebands appear at the intervals of horizontal frequency $f_H$ with the chrominance subcarrier frequency $f_{SC}$ being centered. Thus, if the capture range of the PLL type color synchronizing circuit is wide, color synchronization is achieved at a frequency other than the frequency $f_{SC}$ in the center, so that a correct color is not reproduced, resulting in an unclear picture.

In order to prevent such a situation, the capture range of a PLL circuit constituting the color synchronizing circuit must be made less than the repetition frequency $f_H$ of the color bursts. Thus, conventionally, the crystal resonator 12e having a large Q value has been used in the VCO. When such a crystal resonator is used, the capture range of the PLL circuit can be made approximately ±500 Hz, so that erroneous phase lock can be prevented. On the other hand, such a crystal resonator is expensive. In addition, the following problem occurs.

More specifically, when the above described crystal resonator having a large Q value is used as the VCO, the time difference appears between an input and an output of the VCO. Specifically, a delay of approximately 1.8 milliseconds occurs in the output. Such a delay is a period corresponding to approximately 30 horizontal lines. Color synchronization is not achieved due to such a delay, so that the hue of a picture changes, whereby the picture becomes unclear.

Due to the problems, if a resonator having a small Q value and short capture time is used as the VCO, the above described erroneous phase lock occurs, so that the PLL circuit cannot be effectively used as, for example, a color synchronizing circuit in a VTR in spite of the short capture time thereof.

SUMMARY OF THE INVENTION

Therefore, an object of the present invention is to provide a burst/continuous wave converting apparatus which can quickly and precisely generate a continuous wave based on bursts.

Another object of the present invention is to provide a burst/continuous wave converting apparatus having a wide capture range.

Still another object of the present invention is to provide a burst/continuous wave converting apparatus having a short capture time.

Yet still another object of the present invention is to provide a burst/continuous wave converting apparatus using a low-cost resonator having a small Q value.

A further object of the present invention is to provide a burst/continuous wave converting apparatus which is advantageous as a synchronizing circuit for equipment in which jitter frequently occurs, such as a VTR.

Briefly stated, the burst/continuous wave converting apparatus according to the present invention comprises a circuit for intermittently supplying a burst signal having a predetermined frequency and phase at a constant repetition frequency, a device responsive to the supplied burst signal for generating a continuous wave having a controlled frequency and phase, a delay circuit having a delay time which is approximately integer multiples of a cycle of the burst signal, a switching circuit applying directly the burst signal to the continuous wave generating device in a period during which the burst signal is supplied and applying the burst signal to the delay device in a period other than the period during which the burst signal is supplied to delay the burst signal by the delay time, to apply the same to the continuous wave generating device.

In accordance with another aspect of the present invention, the switching circuit sequentially applies an output of the delay circuit to the continuous wave generating circuit while circulating the burst signal through the delay circuit in the period other than the period during which the burst signal is supplied.

In accordance with still another aspect of the present invention, the continuous wave generating circuit includes a PLL circuit.

A principal advantage of the present invention is that the capture range of the burst/continuous wave converting apparatus can be made wider by making the repetition frequency of the supplied burst higher.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2A is a waveform diagram showing color bursts of a received video signal in the color TV receiver shown in FIG. 1;

FIG. 2B is a diagram showing the frequency spectrum of the color bursts shown in FIG. 2A;

FIG. 4A is a waveform diagram showing color bursts applied to a phase detector circuit according to the embodiment shown in FIG. 3;

FIG. 4B is a diagram showing the frequency spectrum of the color bursts shown in FIG. 4A; and FIG. 5 is a block diagram showing an example of a circuit specifying a portion enclosed by a dot and dash line in FIG. 3.

DESCRIPTION OF THE PREFERRED EMBODIMENT

Figure 3:
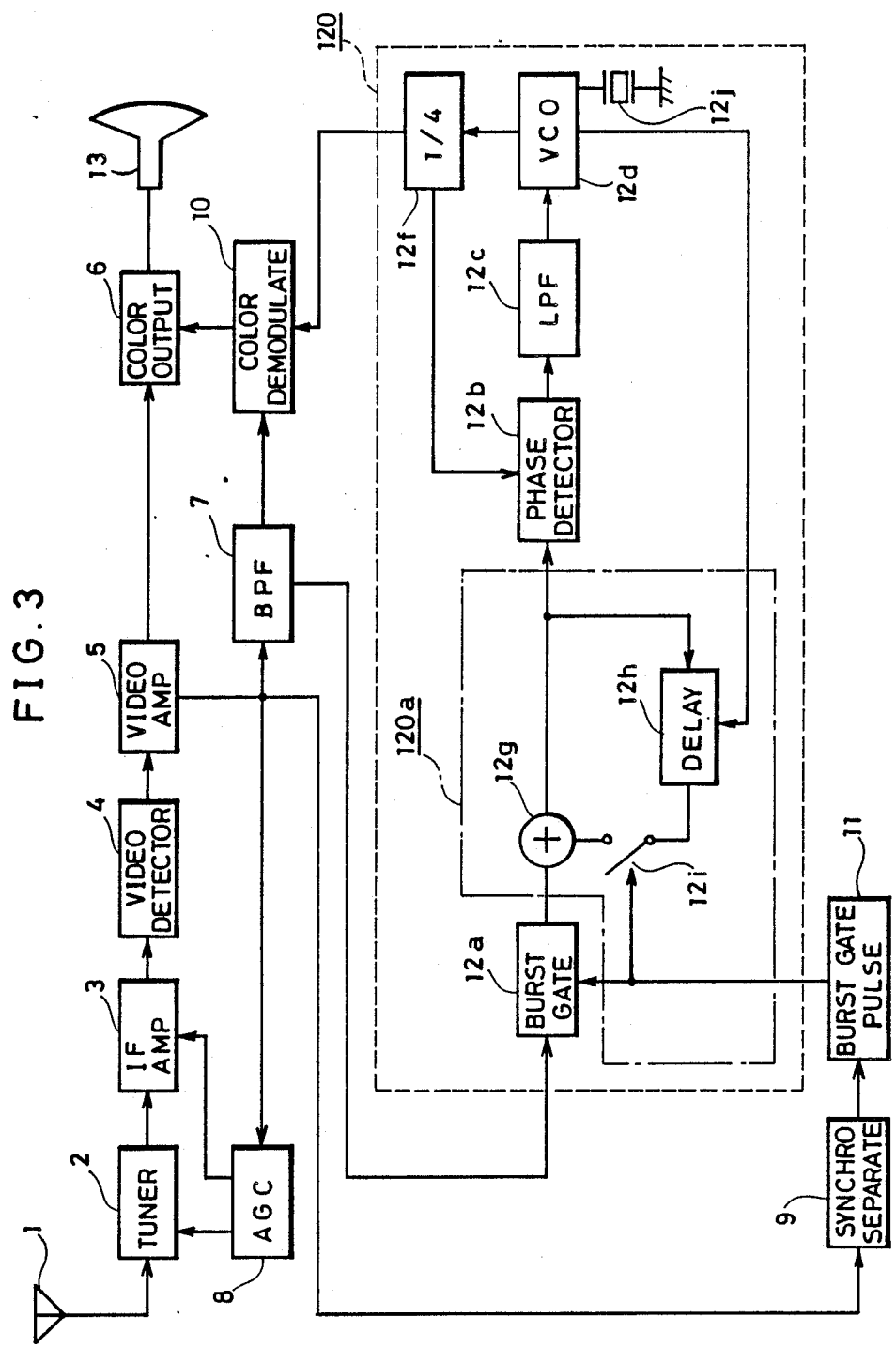
FIG. 3 is a schematic block diagram showing a color TV receiver comprising a PLL type color synchronizing circuit according to one embodiment of the present invention.

FIG. 3 is a block diagram showing schematically a color TV receiver having a PLL circuit which is one embodiment of a burst/continuous wave converting apparatus according to the present invention incorporated therein as a color synchronizing circuit.

Figure 1:
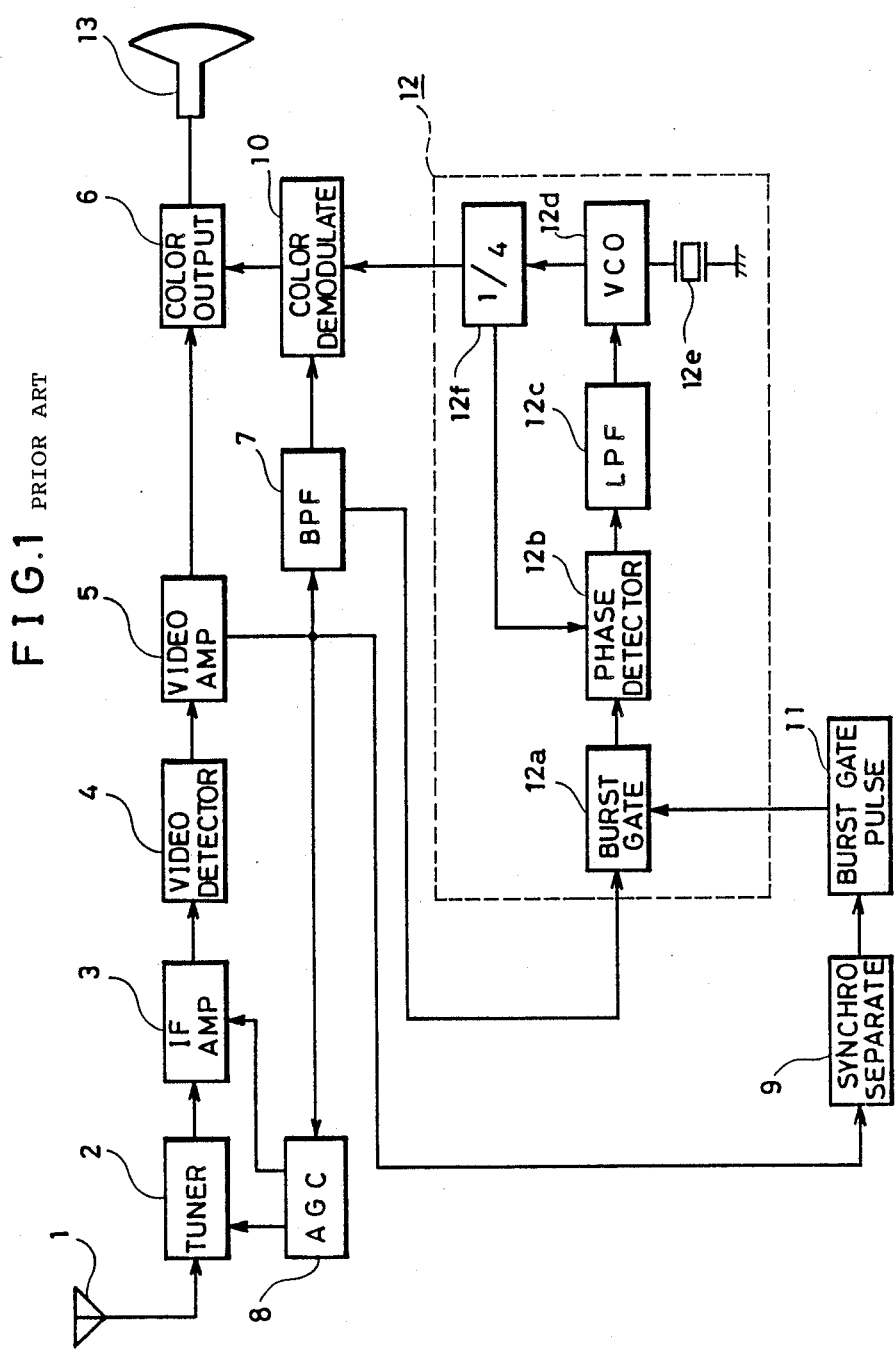
FIG. 1 is a schematic block diagram showing a TV receiver comprising a conventional PLL type color synchronizing circuit.

The embodiment shown in FIG. 3 is the same as the conventional example shown in FIG. 3 is the same as the following. More specifically, a portion 120a enclosed by a dot and dash line in a PLL type color synchronizing circuit 120 shown in FIG. 3 is newly added, and a ceramic resonator 12j is used as a resonator of the VCO 12d. The ceramic resonator 12j is smaller in Q value than the crystal resonator 12e used in the conventional color synchronizing circuit 12 shown in FIG. 1. However, the cost of the ceramic resonator 12j is significantly lower.

More specifically, color bursts extracted by a burst gate circuit 12a are applied to a phase detector circuit 12b as well as a delay circuit 12h through an adder 12g. The delay circuit 12h delays the input color bursts by approximately 4 μ seconds, which is structured by, for example, a shift register. An output of the delay circuit 12h is applied to the adder 12g through a switch 12i. The switch 12i is opened or closed in response to a burst gate pulse applied from a burst gate pulse generating circuit 11 such that the switch 12i is opened in a burst period while being closed in a period other than the burst period. As a result, the color bursts from the burst gate circuit 12a are directly supplied to the phase detector circuit 12b during the burst period, while color bursts delayed by being circulated through a loop comprising the delay circuit 12h, the switch 12i and the adder 12g is sequentially applied to the phase detector circuit 12b in the period other than the burst period.

FIG. 4A is a waveform diagram showing the color bursts applied to the phase detector circuit 12b in the embodiment shown in FIG. 3, and FIG. 4B shows the frequency spectrum thereof. Referring now to FIGS. 4A and 4B, description is made on the delay time of the delay circuit 12h. First, the repetition cycle of the color bursts is a horizontal period, i.e., 64 μ seconds. as described above, while the back porch of a horizontal synchronizing signal having the color bursts superimposed thereon is 4 μ seconds. Thus, when the delay time of the delay circuit 12h is made approximately 4 μ seconds, the repetition frequency of the color bursts supplied to the phase detector circuit 12b becomes 16$f_H$ as shown in FIG. 4A. In the frequency spectrum, as shown in FIG. 4B, sidebands which appear at the intervals of $f_H$ with the chrominance subcarrier frequency $f_{SC}$ being centered are significantly decreased, as compared with those in the conventional example shown in FIG. 2B, so that the sidebands of $f_{SC}$ are substantially spaced ±16$f_H$ apart from $f_{SC}$. As a result, even if the capture range of the PLL circuit serving as a color synchronizing circuit is wide, erroneous synchronization with a frequency other than $f_{SC}$ is not achieved. More specifically, even if a resonator having a small Q value and short capture time is used as the VCO, erroneous phase lock does not occur.

Additionally, each of the color bursts delayed as described above must coincide in phase with the original color bursts which are not delayed. Thus, a delay time T of the delay circuit 12h shown in FIG. 3 must be integer multiplies of a cycle of a chrominance subcarrier. More specifically, the following condition must be satisfied:

$$T = (1/f_{SC}) \cdot n \ (n: \text{integer})$$

In the embodiment shown in FIG. 3, an output of the VCO 12d is used as a clock for the shift register constituting the delay circuit 12h, so that the delayed color burst completely coincides in phase with the color bursts before delay. In addition, the delayed color burst is not attenuated. As this delay circuit 12h, a CCD delay line, a glass delay line, an SAW filter, a CR phase shifter or the like can be used in addition to the above described shift register.

Additionally, FIG. 5 is an example of a circuit specifying the portion 120a enclosed by a dot and dash line in FIG. 3, which is theoretically equivalent to the portion 120a shown in FIG. 3. In the example shown in FIG. 5, the portion 120a comprises an LPF 12k receiving color bursts from the burst gate circuit 12a shown in Fig 3, an A-D converter 12l for A-D converting an output of the LPF 12k, a memory 12m storing data converted into a digital signal by the A-D converter 12l a D-A converter 12n for D-A converting the data read out from the memory 12m, an LPF 12p receiving a signal converted into an analog signal by the D-A converter 12n, and an address pointer 12q for specifying write/read address of the memory 12m. The color burst output from the LPF 12p is applied to the phase detector circuit 12b shown in FIG. 3. In addition, the timing of conversion by A-D converter 12l and the D-A converter 12n and the timing of addressing by the address pointer 12q are controlled in response to a clock from the VCO 12d shown in FIG. 3. The address pointer 12q corresponds to the switch 12i shown in FIG. 3, which is responsive to the burst gate pulse applied from the burst gate pulse generating circuit 11 to be enabled only in the burst period. As a result, only in the burst period, data of the color bursts from the burst gate circuit 12a is written in the memory 12m at the designated address. This data is read out at timing of the clock from the VCO 12d until new data is written in the next burst period, to be applied to the phase detector circuit 12b as repetition of the color bursts shown in FIG. 4A.

As described in the foregoing, according to one embodiment of the present invention, since the capture range of the PLL circuit serving as a color synchronizing circuit can be made wider, a resonator having a small Q value and short capture time, i.e., a low-cost resonator (for example, the above described ceramic resonator) can be used as the VCO, in which case erroneous phase lock does not occur. In addition, since the capture time of the PLL circuit can be shortened, such a PLL circuit can be effectively used as, for example, a color synchronizing circuit in a VTR in which jitter frequently occurs.

Additionally, although in the above described embodiment, description was made for a case in which the present invention is applied to the PLL type color synchronizing circuit generating a chrominance subcarrier which is a continuous wave in response to the color bursts in the video signal, it should be noted that the present invention is not limited to the same. For example, the present invention can be applied to any case in which a continuous wave must be generated in response to applied bursts.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A burst/continuous wave converting apparatus, comprising:
   burst signal means for intermittently supplying a burst signal having a predetermined frequency and phase at a constant repetition frequency;
   PLL circuit means responsive to said supplied burst signal for generating a continuous wave having a controlled frequency and phase, said PLL circuit means comprises
      voltage controlled oscillator means for generating said continuous wave, and
      phase detector means for comparing phases of said supplied burst signal with said continuous wave output from said voltage controlled oscillator means;
   delay means having a delay time which is approximately integer multiples of a cycle of said burst signal, said delay means utilizes an output of said voltage controlled oscillator means as a clock; and
   switching means for directly applying said burst signal to said PLL circuit means in a period during which said burst signal is supplied and for applying said burst signal to said delay means to delay said burst signal by said delay time and to apply the delayed burst signal to said PLL circuit means in a period other than the period during which said burst signal is supplied.

2. The burst/continuous wave converting apparatus according to claim 1, wherein said switching means comprises
   means for sequentially applying an output of said delay means to said PLL circuit means while circulating said burst signal through said delay means in the period other than the period during which said burst signal is supplied.

3. The burst/continuous wave converting apparatus according to claim 1, wherein
   said voltage controlled oscillator means comprises resonator means having a small Q value.

4. The burst/continuous wave converting apparatus according to claim 3, wherein said resonator means comprises a ceramic resonator.

5. The burst/continuous wave converting apparatus according to claim 1 which further comprises means for generating a signal indicating the period during which said burst signal is supplied,
said switching means being operated in response to said indicating signal.

6. The burst/continuous wave converting apparatus according to claim 1, wherein
said delay means comprises a memory.

7. The burst/continuous wave converting apparatus according to claim 1, wherein
said burst signal comprises color bursts of a color television signal, and said continuous wave comprises a chrominance subcarrier.

8. The burst/continuous wave converting apparatus according to claim 7, wherein
the repetition frequency of said burst signal comprises a horizontal frequency of the color television signal.

* * * * *